US006643379B1

(12) United States Patent
Onglao

(10) Patent No.: US 6,643,379 B1
(45) Date of Patent: Nov. 4, 2003

(54) ACOUSTICAL TRANSDUCER FOR RECREATING A SPATIAL SOUND STAGE AND IMPROVED LOCALIZATION OF ORIGINAL SOUNDS SOURCES

(76) Inventor: Roland Ed Onglao, 19420 Hallmark La., Cerritos, CA (US) 90703

( * ) Notice: Subject to any disclaimer, the term of this patent is extended or adjusted under 35 U.S.C. 154(b) by 0 days.

(21) Appl. No.: 09/537,585

(22) Filed: Mar. 28, 2000

(51) Int. Cl.[7] .......... H04R 1/02; H05K 5/00

(52) U.S. Cl. .......... 381/351; 381/335; 181/144; 181/199

(58) Field of Search .......... 381/349, 335, 381/351, 345, 182; 181/156, 144, 145, 199

(56) References Cited

U.S. PATENT DOCUMENTS 4,267,405 A * 5/1981 Russell .......... 381/305
5,374,124 A * 12/1994 Edwards .......... 381/351
5,576,522 A * 11/1996 Taso .......... 181/199
5,802,190 A * 9/1998 Ferren .......... 381/182

* cited by examiner

*Primary Examiner*—Forester W. Isen
*Assistant Examiner*—Brian T. Pendleton
(74) *Attorney, Agent, or Firm*—David A. Balasco; Belasco Jacobs & Townsley, LLP

(57) ABSTRACT

The present invention relates to a unique stereophonic speaker system of unique construction and true left and right speakers assemblies, booth physically and electrically. The speaker assemblies, located to the left and right front sides of a room effectively recreate the sound characteristics of a sound stage. Each speaker assembly includes a plurality of axially aligned speakers supported one above the other in a housing made of flexible material and which can vibrate and resonate. Each speaker assembly includes cutouts in the side wall of the housing, the speakers being positioned such that the side wall with the cutouts are in facing relation. The left channel information must be played in the left speaker assembly and the right channel information must be played in the right speaker assembly.

20 Claims, 9 Drawing Sheets

ACOUSTICAL TRANSDUCER FOR RECREATING A SPATIAL SOUND STAGE AND IMPROVED LOCALIZATION OF ORIGINAL SOUNDS SOURCES

FIELD OF INVENTION

The present invention relates to a stereophonic speaker system and more particularly to an improved and unique speaker system in which uniquely constructed spaced true left and right speaker assemblies are preferably positioned such that a speaker assembly is located to the left and right front sides of a room or listening area thus effectively recreating the sound characteristics of a sound stage.

BACKGROUND OF THE INVENTION

Faithful reproduction of sound (music and/or speech) has been the goal of many in the audio industry. Stereophonic reproduction of sound has been with us for over fifty (50) years and is still the basis for most sound reproducing equipment for home entertainment. Introduced in the early sixties was quadraphonic sound, utilizing four discreet channels and four separate speakers. The goal was to immerse the listener in a soundstage environment by surrounding the listener at or in a theater by the four channel sound source. More recently, surround sound for home or theaters in various different forms has been introduced. The surround sound uses multiple speakers positioned in different locations in an attempt, as close as possible, to recreate as close as possible the original performance of the sound stage. Again, the object was to immerse the listener in sound, mimicking the sound characteristics of a sound stage.

In a typical sound stage for recording a stereophonic sound, the stage usually consists of two microphones, each located in the front left and front right of the source of the sound, as shown diagrammatically in FIG. 1 and which will be described further. The listener is to the front of the microphones and between the two, as shown. Multi-microphone techniques have evolves over the years enabling the recording engineer to re-locate the positions of the various musicians and/or vocalists to different places on the sound stage in an attempt to emulate the kind and quality of sound which the engineer seeks. The techniques for creating and arranging the sound stage using multiple microphones are well known and discussion thereof is beyond the scope of this invention. However, it is the case that the listener at a sound stage hears a sound reproduction as close as possible to the original performance.

The typical prior art stereophonic model is illustrated diagrammatically in FIG. 2 and will be described further below. In its basic form, the system includes two channels of sound information reproduced by a left and right speaker, as shown. The listener in front of and between the two speakers hears an illusionary sound stage between the two speakers, up front and up to the rear wall at the back of the speakers' location. Due to room boundary reflections, speaker cabinet diffraction, and reflection and psychoacoustic effect, the illusion of a sound stage would appear to be centrally located only in front of the spaced speakers. Various forms of signal processing, such as DSP, have been developed to counteract the effects of diffraction and room boundary reflections. These techniques were successful, to some extent, but due to the difference in room layouts, differing acoustic properties of floors, walls and ceilings, the desired result of reliably replicating the sound in a sound stage was not reasonably achieved. Furthermore, the introduction of signal processing in the signal path may produce undesirable artifacts in the electrical signals.

It is thus apparent that a need exists for a relatively simple speaker system which emulates the sound characteristics of a sound stage and compensates for the differing acoustic properties of floors, ceilings, walls and room geometry.

It is an object of this invention to preserve the original signal in its purest form as generated at the sound stage by utilizing the room boundary reflections and the acoustical blending of R-L and L-R stereo information by the use of a unique speaker system which effectively recreates the sound stage.

It is also an object of this invention to provide an improved speaker system including true left and true right speaker assemblies, each having a plurality of axially aligned speakers and a side wall with spaced cutouts in alignment with some of said speakers.

Another object of this invention is to provide a relatively simple stereophonic speaker assembly which includes a true left and true right speaker assembly, the left unit receiving left channel information and the right unit receiving right channel information.

Yet another object of this invention is to recreate a sound stage reproduction of sound by the use of left and right speaker assemblies, each having facing side walls with apertures therein for faithful reproduction of such sound.

BRIEF DESCRIPTION OF THE INVENTION

The above and other objects of this invention are achieved through the use of a pair of unique stereo speakers which effectively recreates the original sound stage acoustics.

In accordance with this invention, each speaker assembly consists of seven full range drivers vertically mounted, one above the other, with a tweeter located between selected drivers. The speakers are mounted on a tubular column which may be square or circular or other shape having a front and side faces. In a preferred form, the column is constructed of a flexible material such as 1/16 inch structural polyvinyl plastic. The column configuration of the drivers creates a diffraction-free baffle board. In a preferred form, the seven drivers are housed in five different and separate chambers. The first three drivers are housed in a single chamber while drivers four through seven are each housed in four separate chambers. The result is the creation of and the provision of a spherical sound field, encompassing the left and right speakers, much like a sound stage.

In addition, the chamber containing the first three drivers and the single chambers of the fifth and seventh driver include axial and horizontally disposed cutouts. These cutouts are intended to optimize the sound stage effect and performance of the drivers. In a preferred form each cutout is positioned perpendicular to the forward axis of the drivers and in a side face or wall of the support so that it faces the other speaker assembly on the other side of the listening area. In effect, there is a true right and a true left speaker assembly, each spaced from the other. These cutouts are intended to perform the following functions.

In the case of the left speaker assembly, there is cancellation of a certain band of audio frequencies (300 Hz to 3000 Hz) to move the virtual sound source of the left speaker assembly towards the rear and to the left of the speaker assembly. The cutouts in the left speaker also project an opposite polarity sound towards the right speaker assembly, creating a negative-left minus right sound information at the intended sound stage area. The cutouts in the left speaker assembly also effectively reduce enclosure resonance which minimizes sound coloration.

In the case of the right speaker assembly, the cutouts cancel a certain band of audio frequencies (300 Hz to 3000 Hz) to move the virtual sound source of the right speaker assembly towards the rear and to the left of the speaker assembly. The cutouts in right speaker assembly also project an opposite polarity sound towards the left speaker assembly, creating a negative-right minus left sound information at the intended sound stage area. Again, the cutouts in the right speaker assembly also effectively reduce enclosure resonance which minimizes sound coloration.

Accordingly, the cutouts create a centrally located sound stage behind both speaker assemblies.

The present invention is also unique in that there is a true right speaker assembly and a true left speaker assembly; these speaker assemblies are not interchangeable either electrically or physically. Electrically reversing the left and right channel information will produce a detrimental effect on the sound stage; localization of the performers will be skewed. Mechanically reversing the speakers (left to right and right to left) will effectively destroy the sound stage reproduction and the sound stage will revert to a conventional speaker's sound stage. Thus, the left channel information must be played back to the left channel speaker and the right channel information must be played back to the right channel speaker. The left and right speaker assemblies must be located at their respective side of the listening area (in relation to the listener facing the speaker).

This invention has many other advantages, and other objectives, which may be more clearly apparent from consideration of the various forms in which it may be embodied. Certain versions of such forms are shown in the drawings accompanying and forming a part of the present specification.

These forms will now be described in detail for the purpose of illustrating the general principles of the invention; but it is understood that such detailed description is not to be taken in a limiting sense.

DETAILED DESCRIPTION OF THE INVENTION

Figure 1:
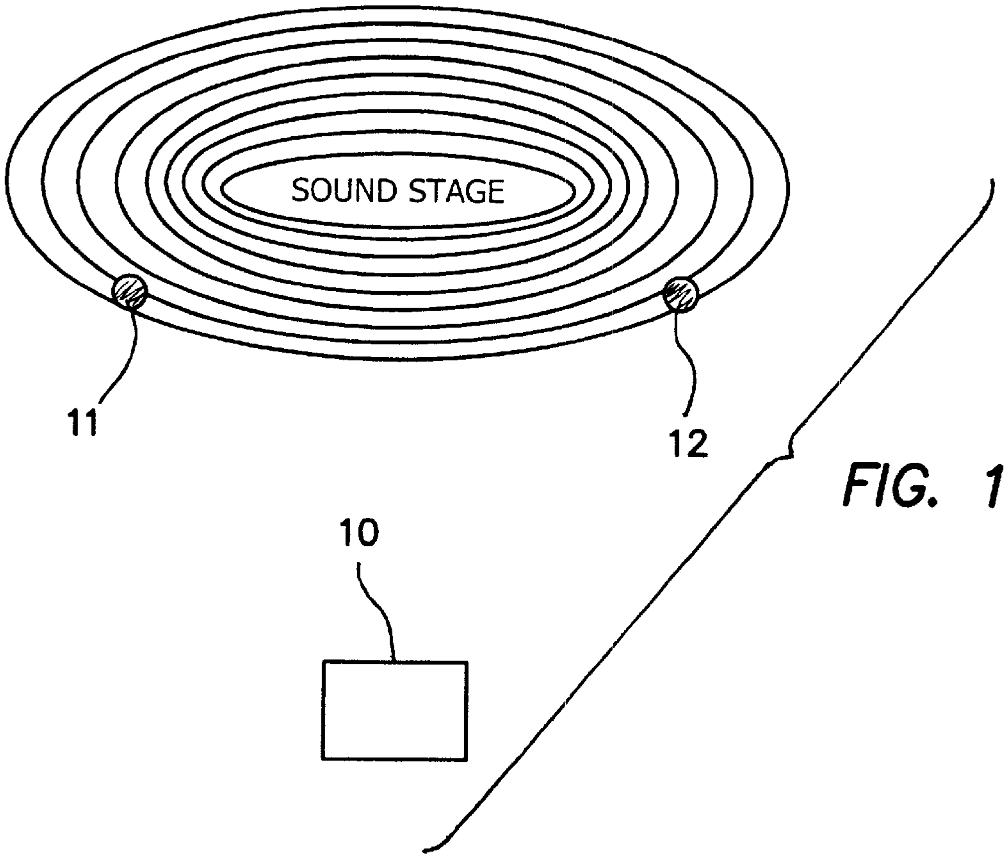
FIG. 1 is a diagrammatic illustration of a prior art sound stage.

Referring to FIG. 1, a typical prior art sound stage is illustrated diagrammatically with a generally conventional set up for recording. The listener 10 is in the front of the stage with a left microphone 11 and a right microphone 12 positioned towards the front of the stage and spaced from the listener. This typical arrangement results in sound being recorded in a right and left manner.

Figure 2:
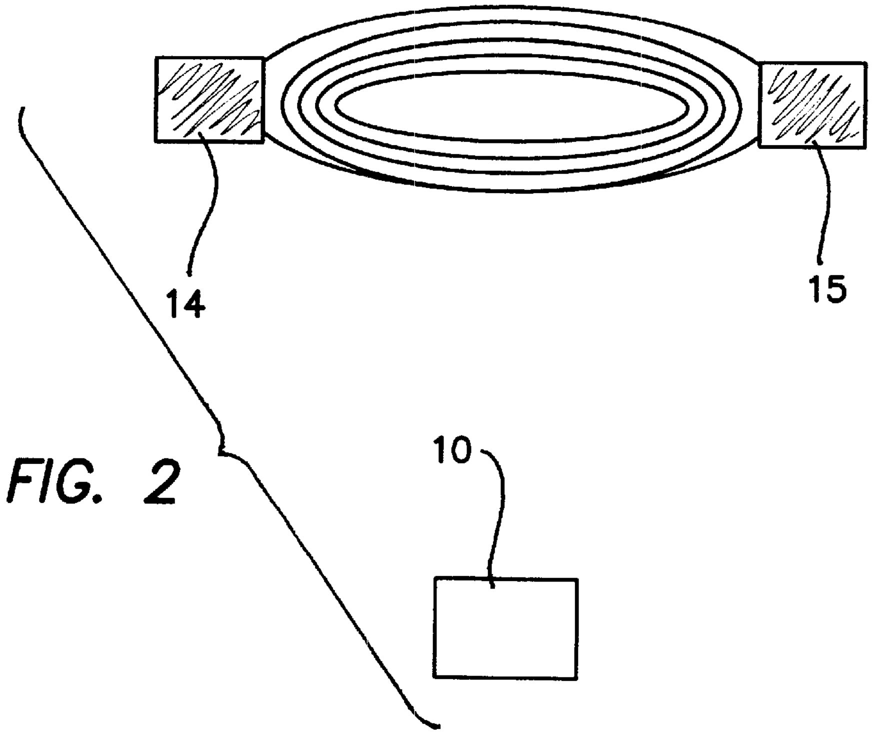
FIG. 2 is a diagrammatic illustration of a prior art arrangement of stereo speakers.

Referring to FIG. 2 a typical prior art arrangement or placement of stereo speakers for playing stereo sound recordings or broadcasts is shown. The listener 10 is positioned to the front of left and right speakers 14 and 15. The speakers may be switched with no noticeable effect. The resulting sound is effectively focussed between the speakers 14 and 15 and if one stands in the area of focus, there is fairly good reproduction of sound in a stereo manner. The difficulty, however, is that to replicate the sound of the sound stage, the listener should stand between the two speakers. Positioned as illustrated in FIG. 2, to the front and spaced from the speakers, the sound stage sound is not replicated.

Figure 3:
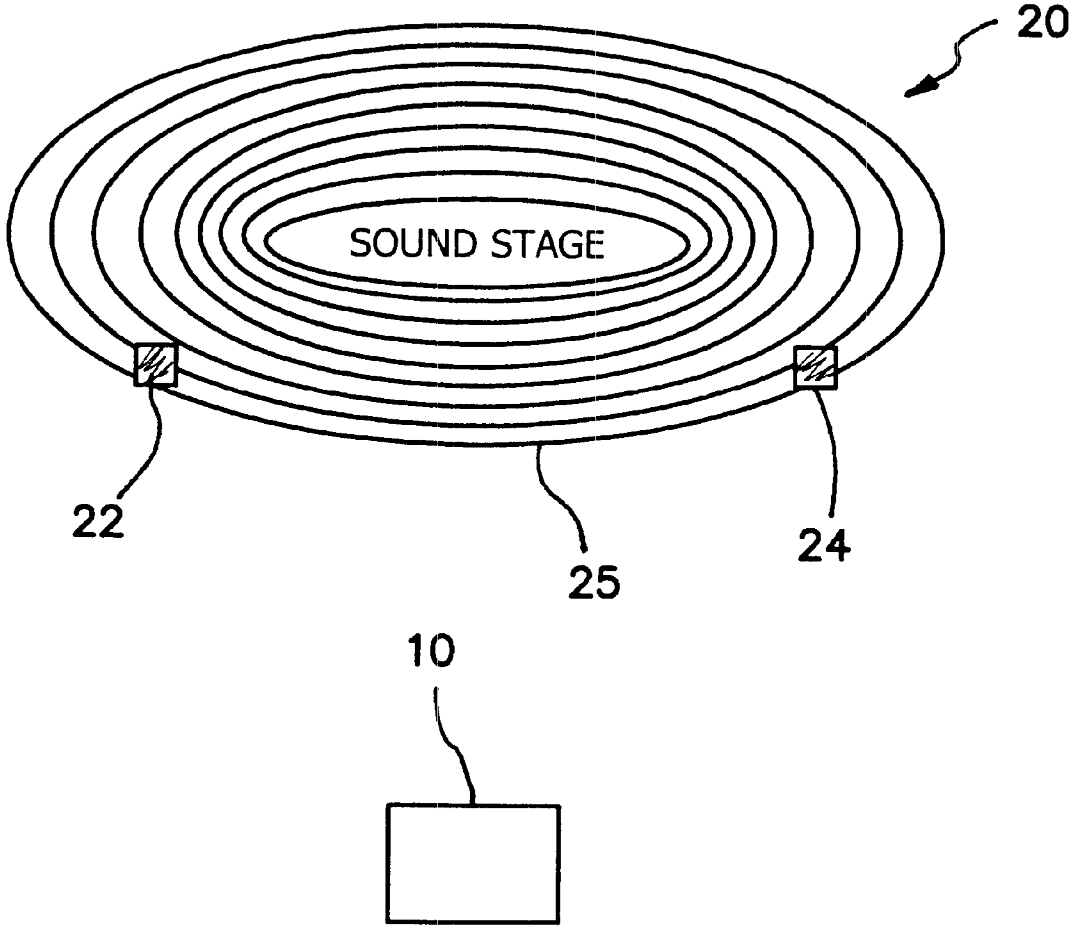
FIG. 3 is a diagrammatic illustration of the speaker system of the present invention.

Referring now to FIG. 3, the system 20 of this invention is illustrated and includes spaced left and right stereo speaker assemblies 22 and 24, located where the microphones of a sound stage are located as shown in FIG. 1, with the listener 10 located where indicated and in about the same position as was illustrated in FIG. 2. In this particular case, however, the left and right speaker assemblies cannot be switched, as will be explained. It will be noted however, that the sound envelope 25, a spherical sound envelope, is basically the same as the sound envelope of the sound stage illustrated in FIG. 1. A better understanding of the vastly improved performance of the speaker system of this invention will become apparent from the following description.

Figure 4:
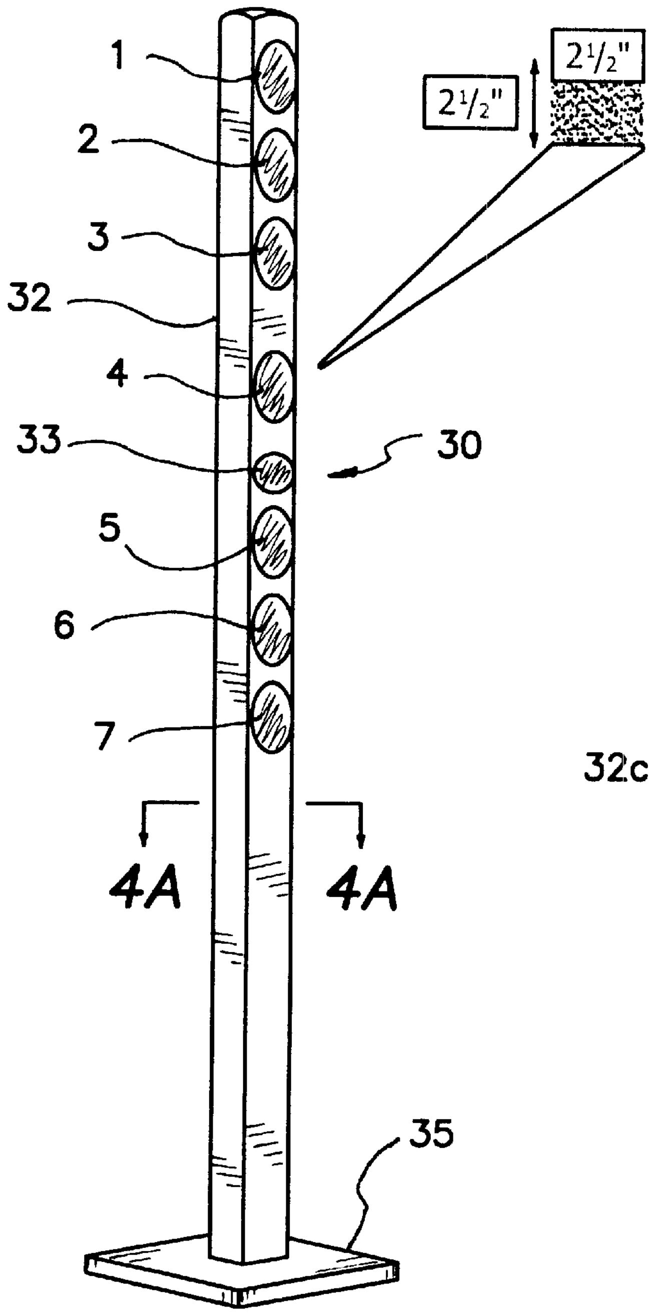
FIG. 4 is a front view of a speaker assembly in accordance with the present invention.
Figure 4A:
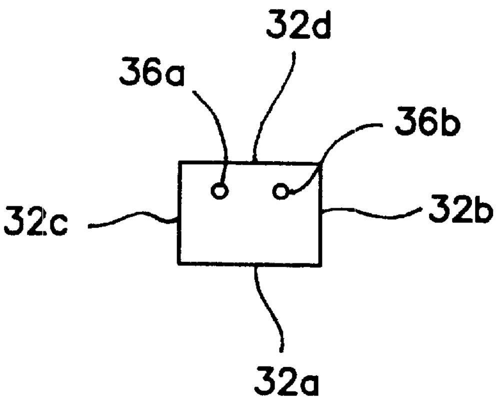
FIG. 4*a* is a sectional view along the line 4*a*—4*a* of FIG. 4.

Referring to FIG. 4, a speaker assembly 30 in accordance with the present invention is shown. The speaker assembly 30 includes a plurality of drivers (speakers) shown as numbered 1 through 7, with a tweeter 33 positioned between speakers 4 and 5 and supported in an elongated support housing 32 which is essentially square, e.g., 2½ by 2½ and about 66 inches high, see FIG. 4A. It is understood that other dimensions may be used, but those set forth are the preferred dimensions. The speakers may be commercially available speakers such as Maxon 4 ohm generic speakers or Maxon 8 ohm generic speakers or Aura 3×2 Neoradial technology speakers.

The material of the speaker housing is preferably a self supporting but flexible material such as a polyvinyl plastic, as contrasted to rigid and inflexible materials used in most other speaker assemblies, such as wood or metal. The reason for flexibility is the need to control the structure's tendency to resonate or vibrate. This control is achieved by drivers 4 and 6 working out of phase relative to drivers 1, 2, 3, 5 and 7. Materials other than polyvinyl may be used provided that their tendency to resonate and vibrate is controllable by the method and structure described above.

The housing 32 is basically a hollow elongated tubular member and may, for example, be an extruded plastic member in which the tube may be of any of a variety of colors. The color brown is preferred to simulate furniture or other furniture simulating colors may be used. The housing includes a front face 32*a* in which the drivers are positioned, side faces 32*b* and 32*c* and a rear face 32*d*. A stockinet type of sleeve and/or a small grill made of metal or plastic is assembled over the housing to cover the drivers and openings in the housing in which the speakers are located and other openings used for assembly purposes. The housing may be supported by a stand 35 or may be hung on or attached to a wall, if desired. Located within the housing are wires 36*a* and 36*b* the latter connected to the speakers, as will be described.

As seen in FIG. 4, the axial spacing between speakers 1–3 is basically uniform, but different from the spacing between the speaker 3 and speaker 4, the latter spacing being greater than the uniform spacing between speakers 1–3. The axial spacing between speakers 5–7 is also uniform and the same as that between speakers 1–3. The spacing between the tweeter and speaker 4 is the same as that between the tweeter and speaker 5, each being greater that the spacing between speakers 1–3, but not as great as that between speakers 3 and 4. This pattern of spacing assists in providing symmetry of sound reproduction.

Figure 5:
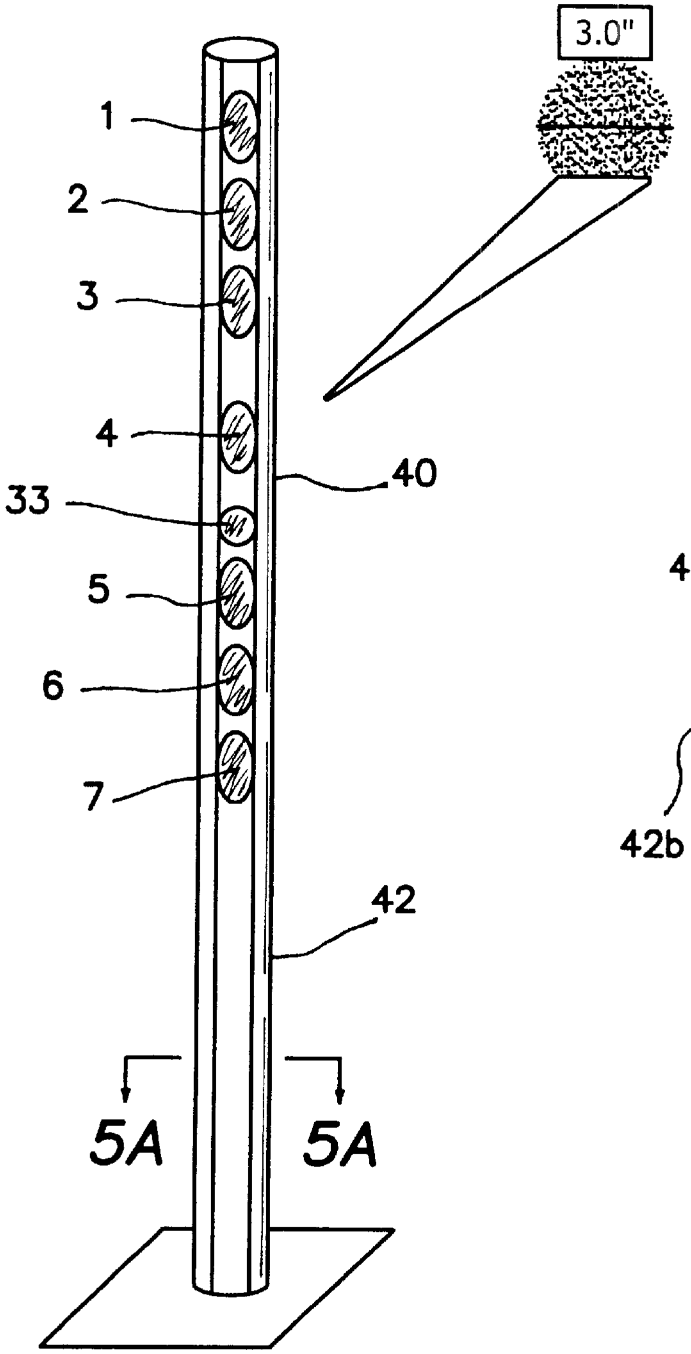
FIG. 5 is a front view of a another form of speaker assembly in accordance with the present invention.
Figure 5A:
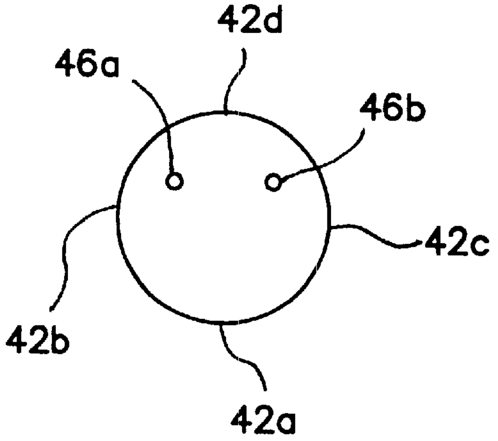
FIG. 5*a* is a sectional view taken along the line 5*a*—5*a* of FIG. 5.

Another form of speaker assembly 40 is illustrated in FIG. 5 in which a tubular support 42 of about 3 inches in diameter and 66 inches long is used as a housing. The support may be of the materials discussed for resonance purposes, as already noted. Again, a series of speakers, 1–7 are mounted in the housing with a tweeter between speakers 4 and 5, as shown, and which have the axial spacing already described. While cylindrical in cross-section, the housing includes a front face 42*a*, side faces 42*b* and 42*c* and a rear face 42*d*, as seen in FIG. 5. The housing is supported on a stand 45, as seen in FIG. 4. Again, wires 46*a* and 46*b* for connection to the speakers are located within the housing 42. As with the unit of FIG. 4, the housing may be of extruded polyvinyl plastic, or of other material, and a stockinet and/or grill cover may be used.

Figure 6:
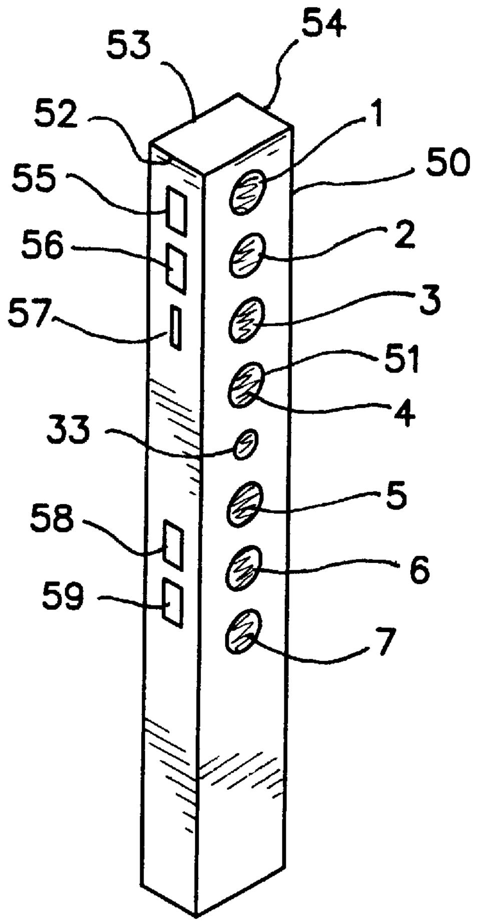
FIG. 6 is a front view of a right speaker assembly in accordance with this invention.

As mentioned, the speaker system of this invention includes a true right and a true left speaker assembly. In effect, the speaker assemblies are positioned with the front face of each facing forward and the side face with the slots or cutouts in the side faces facing each other. Referring to FIG. 6, the right speaker assembly 50 is shown of a form illustrated in FIG. 4. The speaker assembly 50 includes a front face 51, a side face 52, a rear face 53 and another side face 54. The left and right speaker assemblies can be distinguished by the fact that in the right speaker assembly, the face to the left of the front face, face 52, includes a series of slots or cutouts 55–59. The front face 51 includes the drivers 1–7 and the tweeter 33 located between speakers 4 and 5.

As seen in FIG. 6, the axial spacing between speakers 1–3 is the same. There is an axial gap between speaker 3 and speaker 4. There is also the same axial gap between speaker 4 and the tweeter 33. The axial spacing between the tweeter 33 and each of speakers 5–7 is the same and basically that of the gap between speakers 1–3 and less than any of the other gaps mentioned. The side wall 52 to the left of the front wall 51 includes the slots or cutouts 55 through 59 arranged in predetermined alignment with certain speakers. The slots or cutouts are located about 3/16 of an inch from the rear wall and are about 5/8 of an inch wide and 2¾ in axial length.

As seen in FIG. 6, slot 55 is associated with and in alignment with speaker 1, with slots or cutouts 56 and 57 associated with and in alignment with speakers 2 and 3, respectively. There are no slots or cutouts associated with speaker 4 or the tweeter 33. Slot 58 is associated with and aligned with speaker 5 and slot 59 is associated with and aligned with speaker 7. There is no slot associated with speaker 6. The speakers tend to project sound to the rear. The side slots or cutouts 55–59 provide sound opposite to that projected from the front.

Figure 7:
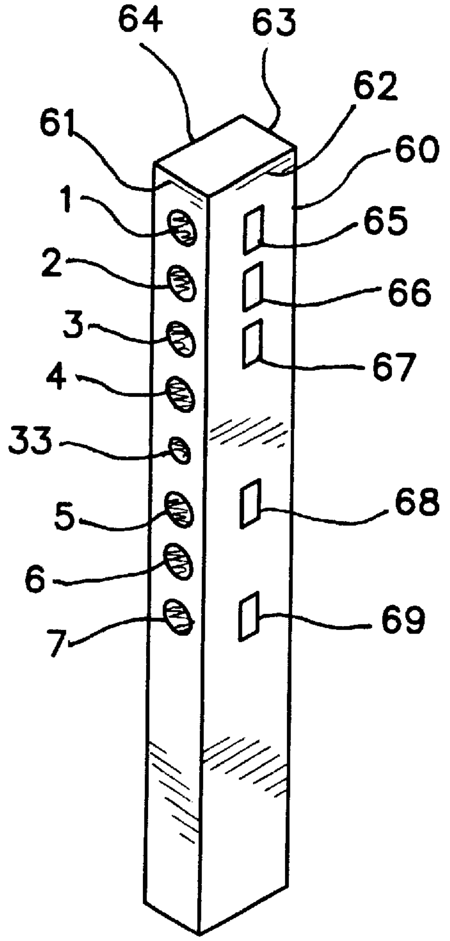
FIG. 7 is a front view of a left speaker assembly in accordance with this invention.

The left speaker assembly 60 is shown in FIG. 7. The front face is 61, with the right side face being 62, the rear face being 63 and the left side face being 64. The speakers 1–7 and tweeter 33 are located in the front face 61 with a series of slots or cutouts 65–69 located in the right side face 62. The spacing of the speakers and tweeter and the alignment of the slots or cutouts is as already described in connection with FIG. 6, save for the fact that in the right speaker assembly, the slots or cutouts are located in the left side face and in the left speaker assembly the slots or cutouts are located in the right side face. In use the speaker assemblies are positioned such that faces with the slots or cutouts face each other while the front faces face forward.

The tweeter augments the sound produced by the full-range speakers 1–7 beginning at 8 kHz. The speaker assemblies may be driven by a 35 watt amplifier, although amplifiers in the range of 20 watts to 120 watts may be used. The system may also use base or subwoofer whose output is in the range of 30 Hz to 200 Hz and positioned in the bottom of the support members or in close proximity to the speaker assemblies. A woofer having an output in the range of 50 Hz to 200 Hz may also be used. The output of the speakers 1–7 is in the range of 200 Hz to 19 kHz.

Figure 8:
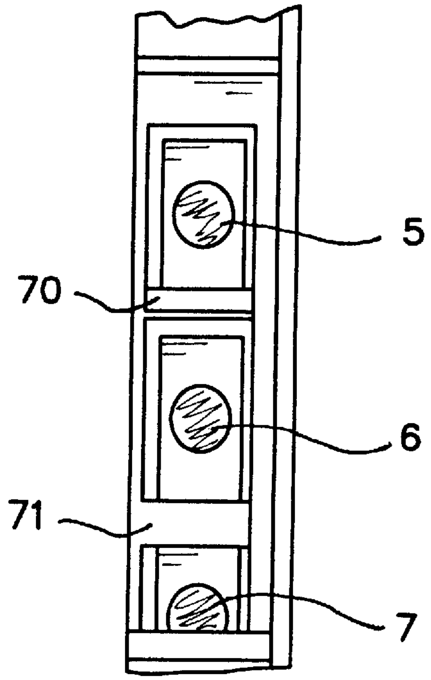
FIG. 8 is a view of the rear of the speaker assembly of this invention showing the openings for positioning the speakers in the housing.

To enhance the reproduction of the sound stage effect, in addition to the structures already described, speaker units 4 and 6 are isolated from each other and from the remaining speaker units by baffles. Referring to FIG. 8, the baffling on each side of speaker 6 is illustrated. Such baffling includes baffle elements 70 and 71, each composed of a sound proof foam such as rigid polystyrene foam. The baffle elements are pre dimensioned to fit between the side walls, between the front and rear face and are inserted between speaker 7 and speaker 5 to isolate speaker 6. The baffling for speaker 4 is basically the same with the baffle elements being inserted between speaker 3 and the tweeter 33. The purpose of the of speakers 4 and 6 and their baffles is twofold: First to cancel the resonance and vibration of the enclosure by producing a signal that is opposite in polarity to the driving signals for speakers 1, 2, 3, 5 and 7. Second, speakers 4 and 6 and their baffles prevent a back sound wave. It is to be noted that the speakers 4 and 6 which are baffled do not include a side slot. The baffling described is used in both the left and right speaker assemblies and for the speakers identified.

Figure 9A:
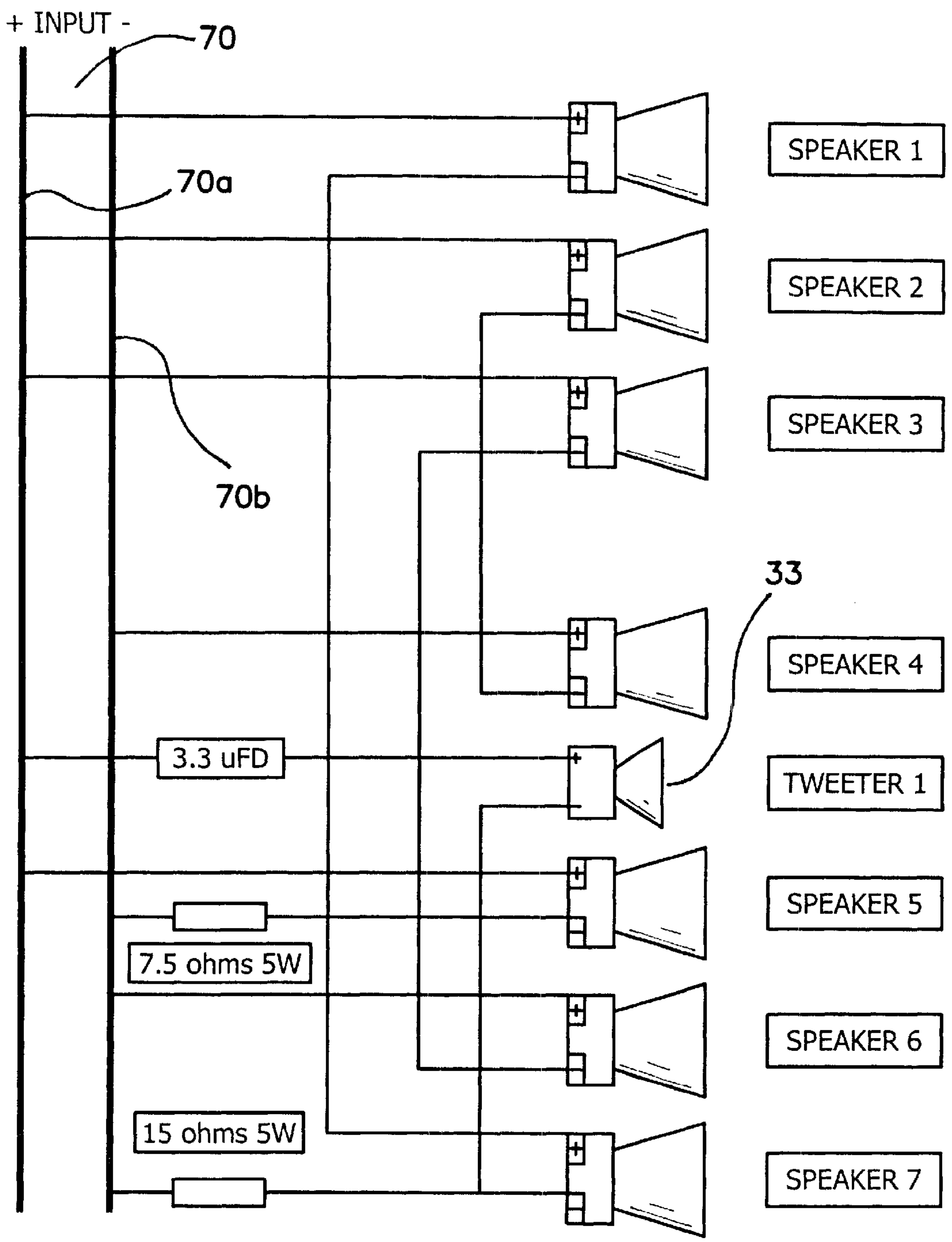
FIG. 9*a* is an illustration of how the speaker assemblies, using speakers with a 4 ohm nominal impedance, are wired in accordance with this invention.

In addition to the physical arrangement of the speaker and speaker assemblies, one aspect of this invention relates to the manner in which the speakers are wired. Referring to FIG. 9*a*, the schematic wiring diagram is shown for speakers having a 8 ohm nominal impedance as receiving a positive and negative input, as indicated at 70. This results in a total impedance of 4 ohms for the whole speaker assembly. The input for the left speaker assembly is the left channel input while that for the right speaker assembly is the right channel input. Each of the speakers is identified by the numbers already used Each speaker includes a conventional positive and negative mounting terminal as indicated. Speakers 1, 2, 3, the tweeter 33, and speaker 5 are wired with the positive input 70*a* to the positive terminal of the speaker. The positive input to the tweeter 33 includes a 3.3 microfarad capacitor. The negative input line 70*b* is connected to the negative terminal of speaker 5, there being a 7.5 ohm, 5 watt resistor in the negative line. The negative input line 70*b* is also connected to the positive terminal of speaker 4. The negative side of speaker 1 is connected to the positive side of speaker 7, while the negative input line is connected to the negative side of speaker 7, the line connected between the negative terminal and the negative input line of speaker 7 including a 15 ohm 5 watt resistor.

The negative terminal of speaker 2 is connected to the negative terminal of speaker 4. The negative terminal of speaker 3 is connected to the negative terminal of speaker 6. The negative terminal of the tweeter 33 is connected to the negative input line downstream of the 15 ohm 5 watt resistor which is in the line, as shown.

Figure 9B:
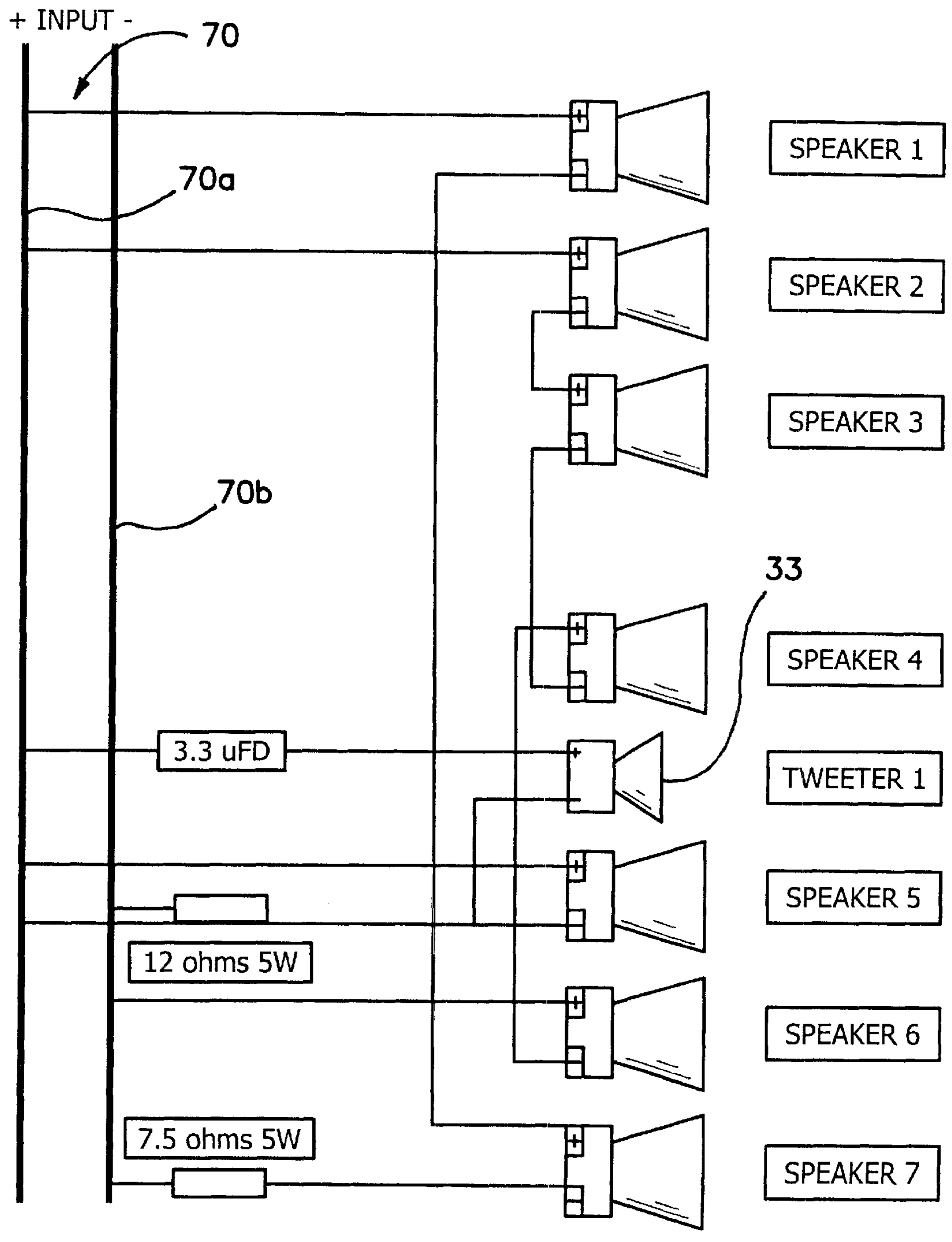
FIG. 9*b* is an illustration of how the speaker assemblies, using speakers with an 8 ohm nominal impedance, are wired in accordance with this invention.

If a speaker assembly with speakers having a 4 ohm nominal impedance is used, the speakers may be wired as shown in FIG. 9*b*, (in which the same reference numerals have been applied to the same components) and will result in a total nominal impedance of 8 ohms. As shown, speakers 1, 2, tweeter 33, and speaker 5 have their positive terminals connected to the positive input line 70*a*. The negative terminal of speaker 1 is connected to the positive terminal of speaker 7, while the negative terminal of speaker 7 is connected to the negative input line 70*b*, there being a 7.5 ohm 5 watt resistance in the line, as shown. The negative terminal of speaker 2 is connected to the positive terminal of speaker 3. The negative terminal of speaker 3 is connected to the negative terminal of speaker 4.

The positive terminal of speaker 4 is connected to the negative terminal of speaker 6. The tweeter includes a 3.3 microfarad capacitor in the line between the positive input line and the positive terminal. The negative terminal of the tweeter 33 is connected to the line connected to the negative terminal of speaker 5 between the 12 ohm 5 watt resister and the negative terminal.

The speakers of the assembly, wired as above described, cooperate with the cutouts and speaker isolation to achieve the results discussed.

Figure 10:
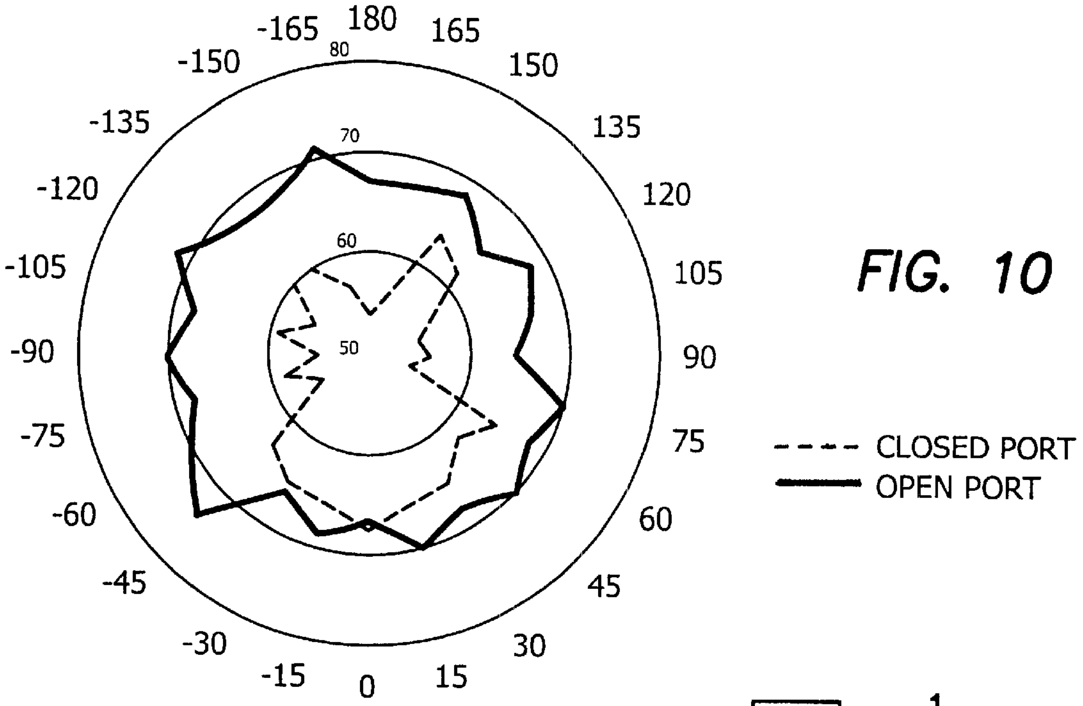
FIG. 10 is a diagram of the polar response of the speaker assembly of this invention.

FIG. 10 illustrates the linear polar response at 1 KHz of an open speaker assembly (cutouts) versus a closed system of the same type of speaker assembly with no cutouts. The intensity is indicated as decibels at the 50 db, 60 db and 70 db level. What is significant is the symmetrical nature of the readings from the open system (cutouts) all of which are above 60 db in essentially all points of the circle, as indicated by the plots at every 15□ around the circle. The plot of the open system is the solid line and that of the closed system is the dashed lines. It can also be seen that the closed system is far from symmetrical as compared to the open system.

Figure 11:
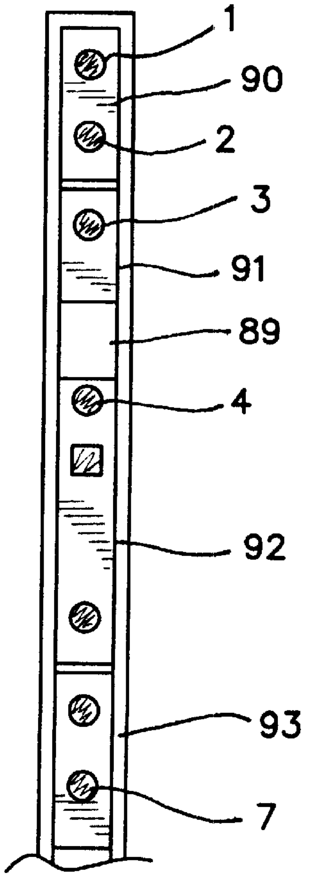
FIG. 11 is a diagrammatic view of the right and left speakers arranged in accordance with this invention.

FIG. 11 illustrates the back wall with the various speakers mounted in the housing. Speaker 1 is at the top of the unit and speaker 7 is at the bottom, the space or closed section between speaker 3 and 4 being shown as well as the relative spacing between adjacent speakers as already described. The rear face includes four elongated openings, 90–93 to provide access to mount the speakers in the housing. After the speakers are mounted in the housing and wired as described, the openings are closed with a cover, such as plastic or the like.

Figure 12:
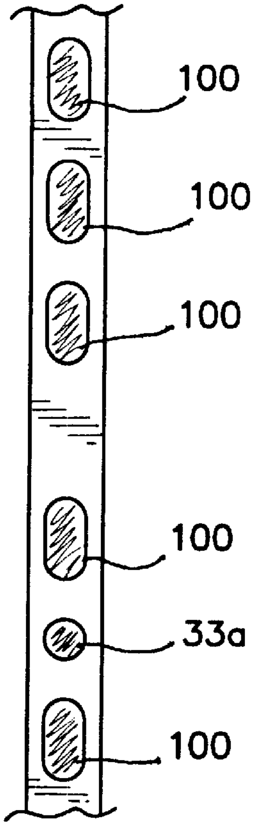
FIG. 12 is a view of a portion of the housing of a speaker assembly of this invention showing the apertures for the speakers.
Figure 13:
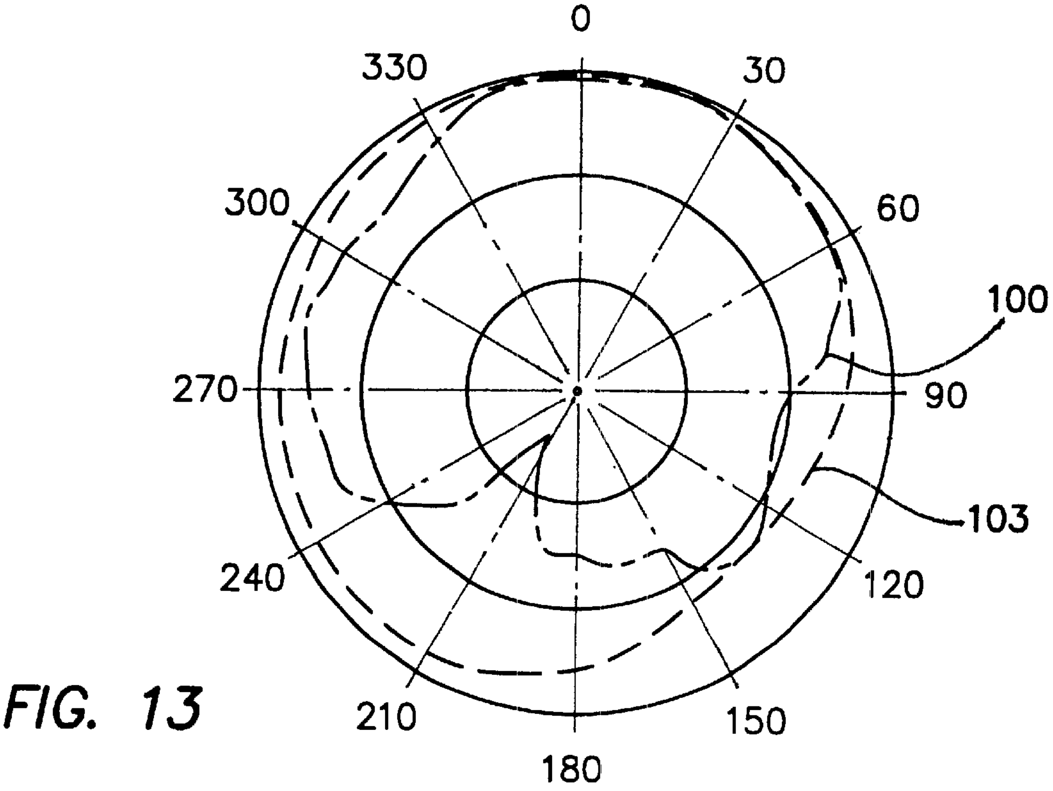
FIG. 13 is a diagram of the polar response of the speaker assembly of this invention in which the cut-outs associated with speakers 1 and 2 are not used.

FIG. 12 is a fragmentary view of the front face with a plurality of axially aligned cutouts 100 showing the top three speakers apertures, the spacing between the third and fourth speaker, the tweeter opening 33*a* and the remaining three openings below 33*a*, only one being illustrated. The speakers and the tweeter and mounted such that they are flush mounted on the front face, with the wiring connectors being located in the interior of the housing. After mounted and wired, the opening in the rear face are covered and a stockinet and/or grill may be assembled over the housing and the latter mounted on a stand or mounted on a wall with the proper orientation of the right and left speaker assemblies.

It is also possible in accordance with the present invention to eliminate the openings with speakers 1 and 2 and use only the opening of speaker 3 with the top three speakers. It was noted that with the speaker assemblies described, having openings associated with the top three speakers, the sound envelope was good with respect to listeners that were standing, as shown in FIG. 10. However, for a sitting audience there was a need to reduce the intensity in the 300 to 3000 Hz range in order to provide a sound envelope that was appropriate for an audience that was sitting or standing.

The effect of covering or eliminating the openings associated with speakers 1 and 2 and retaining the opening with speaker 3 is shown in Figure which is a polar plot at a test frequency of 1000 Hz. Here the reference level is 0 dB=52.75 dB SPL. As seen, the plot 100 in short dashed lines shows a rather unsymmetrical response, especially at the 210 degree position, for a speaker assembly in which there are no openings associated with speakers 1, 2, and 3 (the remaining structure being as described). By contrast, the plot 103 in longer dashed lines represents a rather symmetrical response for a speaker assembly in which the openings associate with speakers 1 and 2 were eliminated or covered. The result was a much improved sound envelope profile in both the vertical and horizontal direction.

It should be understood that this invention is not limited to the detailed descriptions set forth herein which describes in detail the preferred forms of the present invention. Modifications thereof will be apparent to those skilled in the art, based on the above detailed disclosure, but such modifications based on this disclosure may not be deemed to depart from the spirit and scope of the present invention as set forth in the appended claims.

What is claimed is:

1. A speaker assembly for stereophonic sound reproduction which emulates the sound of a sound stage, comprising:

an elongated speaker support housing having a front, rear and side faces, a plurality of apertures in said front face in axial alignment with each other, a speaker located in each of said apertures and supported in said housing, some of said speakers being spaced axially from the adjacent speaker a distance which is uniform while other of said speakers are spaced apart a distance greater than said uniform distance, one of said side walls including a series of open slots or cutouts in alignment with some of said speakers, and some of said speakers including baffles to isolate the speaker from adjacent speakers.

2. A speaker assembly as set forth in claim 1 wherein said housing supports seven speakers in axial alignment.

3. A speaker assembly as set forth in claim 1 wherein said housing is composed of a self-supporting relatively flexible material.

4. A speaker assembly as set forth in claim 2 wherein the axial spacing between the top three speakers and the bottom three speakers is the same and less than that between the third and fourth speaker.

5. A speaker assembly as set forth in claim 2 wherein a side wall on the left side of the housing includes said series of open slots.

6. A speaker assembly as set forth in claim 2 wherein a side wall on the right side of said housing includes said series of open slots.

7. A speaker assembly as set forth in claim 5 wherein said speaker assembly is a right side speaker assembly receiving right channel information.

8. A speaker assembly as set forth in claim 6 wherein said speaker assembly is a left side speaker assembly receiving lef t channel information.

9. A speaker assembly as set forth in claim 1 wherein said speaker assembly is a true left speaker assembly both electrically and physically and further includes means to receive left channel information.

10. A speaker assembly as set forth in claim 1 wherein said speaker assembly is a true right speaker assembly both electrically and physically and further includes means to receive right channel information.

11. A speaker assembly as set forth in claim 2 wherein said slots are in alignment with the top speaker and the fifth and seventh speaker.

12. A speaker assembly as set forth in claim 1 wherein said baffles are in axial alignment and extend between said side walls.

13. A speaker assembly as set forth in claim 12 wherein said baffles are located above and below the sixth speaker and between the sixth and seventh and the fifth and sixth speaker.

14. A speaker assembly as set forth in claim 1 wherein a side wall on the left side of the housing includes said series of slots.

15. A speaker assembly as set forth in claim 1 wherein a side wall on the right side of the housing includes said series of slots.

16. A speaker assembly as set forth in claim 2 wherein said slots are in alignment with the top speaker and the fifth and seventh speaker.

17. A speaker assembly as set forth in claim 7 wherein said left side speaker cooperates with a right side speaker to emulate the sound of a sound stage located to the rear of the speakers.

18. A speaker assembly as set forth in claim 8 wherein said right hand speaker cooperates with a left side speaker to emulate the sound of a sound stage located to the rear of the speakers.

19. A speaker assembly as set forth in claim 1 wherein said housing supports seven speakers in axial alignment with a tweeter between the fourth and fifth speaker, said housing being composed of a self-supporting relatively flexible material, said side wall on the left side of the housing including a series of open slots aligned with some of the top speakers, and said baffles being located between sixth and seventh speaker and between the fifth and sixth speaker.

20. A speaker assembly as set forth in claim 1 wherein said housing supports seven speakers in axial alignment with a tweeter between the fourth and fifth speaker, said housing being composed of a self-supporting relatively flexible material, said side wall on the right side of the housing including a series of open slots aligned with some of the speakers, and said baffles being located between sixth and seventh speaker and between the fifth and sixth speaker.

* * * * *